United States Patent
Yu et al.

(10) Patent No.: US 8,034,711 B2
(45) Date of Patent: Oct. 11, 2011

(54) BONDING STRUCTURE AND FABRICATION THEREOF

(75) Inventors: Chen-Hua Yu, Keelung (TW); Horng-Huei Tseng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/964,195

(22) Filed: Dec. 26, 2007

(65) Prior Publication Data

US 2008/0102198 A1     May 1, 2008

Related U.S. Application Data

(62) Division of application No. 10/795,736, filed on Mar. 8, 2004, now abandoned.

(51) Int. Cl.
*H01L 21/4763* (2006.01)

(52) U.S. Cl. ......... 438/637; 438/629; 438/666; 438/687

(58) Field of Classification Search .................. 438/613, 438/618, 629, 637, 639, 666, 687, 700
See application file for complete search history.

(56) References Cited

U.S. PATENT DOCUMENTS

| | | | |
|---|---|---|---|
| 5,223,455 A * | 6/1993 | Itoh et al. ...................... | 438/656 |
| 5,243,222 A * | 9/1993 | Harper et al. ................. | 257/774 |
| 5,436,412 A | 7/1995 | Ahmad et al. | |
| 5,569,618 A * | 10/1996 | Matsubara ..................... | 438/253 |
| 5,785,236 A | 7/1998 | Cheung et al. | |
| 6,114,243 A | 9/2000 | Gupta et al. | |
| 6,166,444 A * | 12/2000 | Hsuan et al. .................. | 257/777 |
| 6,239,494 B1 | 5/2001 | Besser et al. | |
| 6,265,300 B1 | 7/2001 | Bhansali et al. | |
| 6,274,933 B1 | 8/2001 | Abdelgadir et al. | |
| 6,378,759 B1 | 4/2002 | Ho et al. | |
| 6,451,681 B1 | 9/2002 | Greer | |
| 6,457,234 B1 | 10/2002 | Edelstein et al. | |
| 6,635,497 B2 | 10/2003 | Aggarwal et al. | |
| 6,740,392 B1 * | 5/2004 | Farrar ........................... | 428/209 |
| 6,835,643 B2 | 12/2004 | Akram | |
| 6,844,631 B2 | 1/2005 | Yong et al. | |
| 6,869,873 B2 * | 3/2005 | Bradshaw et al. ............. | 438/630 |
| 7,084,063 B2 * | 8/2006 | Noguchi et al. ............... | 438/691 |
| 7,655,555 B2 * | 2/2010 | Faust et al. .................... | 438/627 |
| 2003/0072928 A1 | 4/2003 | Edelstein et al. | |
| 2004/0084780 A1 | 5/2004 | Yew et al. | |

FOREIGN PATENT DOCUMENTS

| | | |
|---|---|---|
| TW | 420854 | 2/2001 |
| TW | 88116074 | 4/2003 |
| TW | 91123213 | 2/2004 |

\* cited by examiner

*Primary Examiner* — Ori Nadav
(74) *Attorney, Agent, or Firm* — Thomas|Kayden

(57) ABSTRACT

A bonding structure and the method of fabricating the same are disclosed. The bonding structure of the invention includes a copper-based pad formed in an insulator layer and a protection layer substantially covering top surface of the copper-based pad. The protection layer is self-aligned formed and the material thereof is selected from a group consisting of metal nitride, copper alloy, copper compounds, and a combination thereof.

15 Claims, 2 Drawing Sheets

BONDING STRUCTURE AND FABRICATION THEREOF

CROSS REFERENCE TO RELATED APPLICATIONS

This application is a divisional application of pending U.S. patent application Ser. No. 10/795,736, filed on Mar. 8, 2004 and entitled "BONDING STRUCTURE AND FABRICATION THEREOF".

BACKGROUND

The present invention relates to a semiconductor structure and in particular to a copper-based bonding structure with a surface protection layer.

Conventional semiconductor devices typically comprise a semiconductor substrate, normally of doped monocrystalline silicon, and a plurality of sequentially formed inter-layer dielectrics and interconnected metallization layers defining conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different metallization layers are electrically connected by a conductive plug filling with a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor chips comprising five or more levels of metallization are becoming more prevalent as device geometries shrink to submicron levels.

Copper (Cu) and copper alloys have received considerable attention as a replacement material for aluminum (Al) in ultra large scale interconnection metalizations. Copper is relatively inexpensive, easy to process, has lower resistance than aluminum, and has improved electrical properties over tungsten (W), making copper a desirable metal for use as a conductive plug as well as conductive wiring.

In the formation of copper interconnects using a damascene metallization process, copper is exposed in a bonding pad area. The bonding pad area is located on the top surface of the integrated circuit structure formed on the semiconductor substrate. The bonding pad area is the region where wires make contact with bonding pads to form electrical connection with the Cu interconnects. In this case, where the copper interconnects are exposed in the bonding pad area, the copper can be designed to act as an interconnect as well as a bonding pad.

Conventional techniques for wire bonding, however, are not compatible with bonding pads comprising Cu. Existing bonding techniques such as wedge bonding and ultrasonic bonding require thermal agitation, that is, rubbing the wire against the bonding pad to form a bond therebetween. The existing technology works for the bonding of either gold wires or aluminum wires to aluminum pads. However, such technologies do not work for the bonding of gold wires or aluminum wires to copper pads, since copper is easily oxidized, forming copper oxide which is an insulator.

In U.S. Pat. No. 5,785,236 issued to Cheung et. al., methodology is disclosed for electrically connecting wires to a Cu interconnect by forming an intermediate Al pad on the Cu interconnect. In U.S. Pat. No. 6,239,494 issued to Besser et. al. another methodology is disclosed for electrically connecting wires to a Cu interconnect by forming an Al pad and an intermediate diffusion barrier on the Cu interconnect. In both described patents, uses the Al pad is used, however, disadvantageously, as it increases the resistance of the interconnection system.

A need therefore exists to form a reliable copper pad so that conventional wire bonding technology can be employed.

SUMMARY

Accordingly, an object of the invention is to provide a reliable bonding structure adopting copper pad, suitable for wire bonding technology or flip-chip bonding technology, with a protection layer to prevent the surface thereof from oxidizing.

In order to achieve the above object, the present invention provides a bonding structure, comprising a copper-based pad formed in an insulator layer and a protection layer substantially covering a top surface of the copper-based pad.

In one embodiment of the invention, a conductive bonding is further formed over the protection layer connected to connect the copper-based pad.

Another object of the invention is to provide a method of fabricating a copper bonding structure suitable for wire bonding technology or flip-chip bonding technology.

In order to achieve the above object, the present invention provides a method of fabricating a bonding structure, comprising the steps of forming an insulating layer over a substrate and forming a copper-based pad in the insulating layer. A protection layer is then formed substantially covering the top surface of the copper-based pad. A passivation layer is forming over the copper-based pad and the insulating layer and the passivation layer is then patterned to expose a portion of the protection layer.

In one embodiment of the invention, a conductive bonding is further formed over the exposed protection layer to connect the copper-based pad.

In another embodiment of the invention, the protection layer comprises a conductive material selected from a group consisting of metal nitride, copper alloy, copper compounds, and combinations thereof.

In another embodiment of the invention, the protection layer comprises refractory metal.

In another embodiment of the invention, the conductive bonding is a conductive bump or a conductive wire.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

FIGS. 1 to 4 show cross sections of a process for fabricating a copper bonding structure of the invention.

Figure 1:
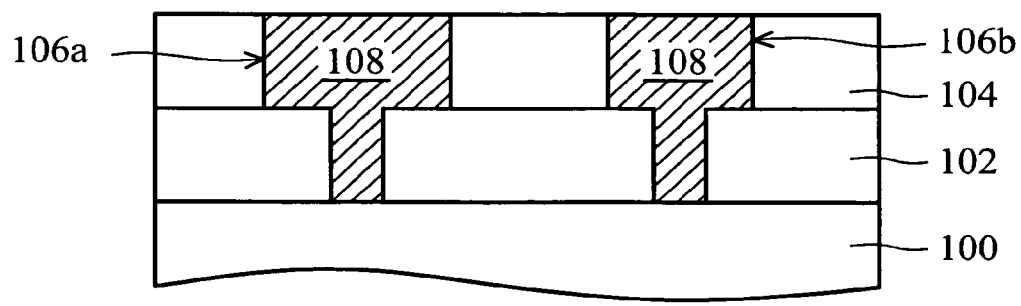
FIGS. 1 to 4 are cross sections showing a process for forming a bonding structure of the invention.

In FIG. 1, an integrated circuit (IC) structure 100 having copper structures 108 formed therein is provided. The integrated circuit structure 100 may comprise a semiconductor substrate having integrated circuit devices and multilayer interconnection structures formed thereon. The integrated circuit devices can be active devices or passive devices formed on the semiconductor substrate and the multilayer interconnection structures can be multi metallization layers supported and spaced by inter-layer dielectric. The formed integrated circuit devices and multilayer interconnection structures, however, are not shown here in the integrated circuit structure 100, for simplicity.

The integrated circuit (IC) structure 100 having copper structures 108 can be fabricated by the following steps. First, a first and a second insulating layer 102 and 104 are sequentially formed on the structure 100. The material of insulating layers 102 and 104 can be oxide, nitride, polymers, spin-on glass, low-k dielectric or a combination thereof. The low-k dielectric can be either organic dielectric such as benzocyclobutene (BCB), SiLK, available from Dow Chemical, and Flare, available from AlliedSignal of Morristown or inorganic dielectric such as hydrogen silsesquioxane (HSQ), fluorocarbon silsesquioxane (FSQ), methylsilsesquioxane (MSQ), nanoglass, or the like. The dielectric constant of the insulating layers 102 and 104 are preferably less than 3.6. The insulating layers 102 and 104 are preferably formed using chemical vapor deposition (CVD) or spin-on coating, although other deposition techniques can be employed as well.

Next, two separate openings 106a and 106b are formed in the first and the second insulating layers 102 and 104 through a conventional dual damascene process, wherein each of the openings includes a narrow via opening in the lower portion for forming interconnects therein and a device opening in the upper portion for forming a conductive line or bonding pad. A copper layer 108 is then formed in the openings 106a and 106b. The copper layer 108 can be formed by blanketing a copper-based material over the second insulating layer 104 and filling the openings 106a and 106b. The copper-based material over the top surface of the second insulating layer 104 is then planarized through a proper etch-back step or a chemical mechanical polishing (CMP) step. The copper layer 108 is thus respectively left in these openings 106a, 106b and the top surfaces thereof are also exposed. The copper-based material of the copper layer 108 can be, for example, high purity elemental copper or copper-based alloys containing minor amounts of zinc (Zn), manganese (Mn), titanium (Ti), aluminum (Al) and germanium (Ge).

Figure 2:
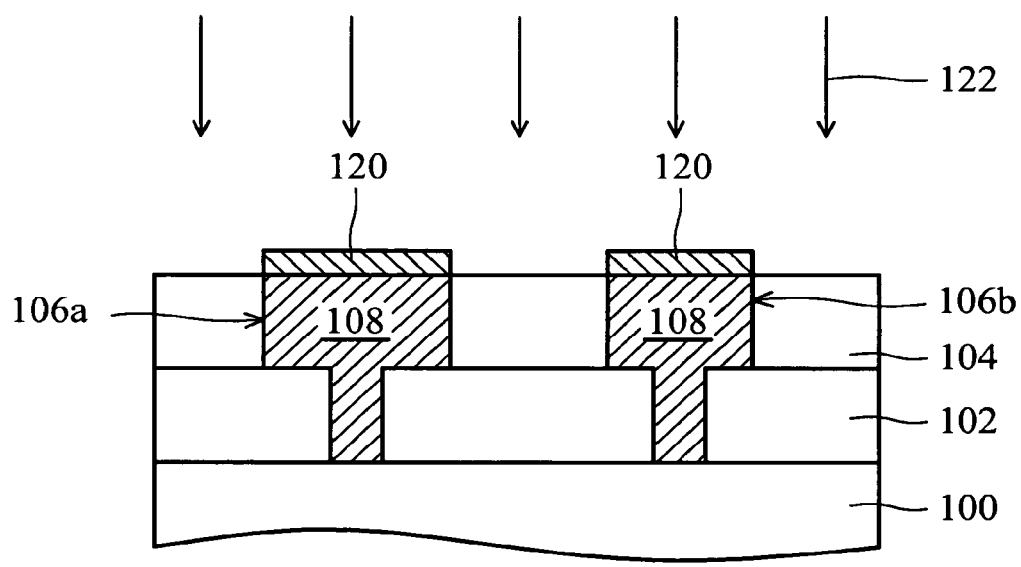

In FIG. 2, a protection layer 120 for preventing oxidation of the top surface of each copper layer 108 is formed on top surface of each copper layer 108. The thickness thereof is about 100 Å to 1000 Å. Here, the protection layer 120 in the present invention is preferably formed by a self-aligned process 122 such as selective chemical vapor deposition (CVD) while additional protective material such as tungsten (W) is formed. Conventional silicidation or nitridation processes (not shown) can also be adopted to form copper compounds such as copper silicde or copper nitride on the top surface of each copper layer 108. The copper compound can be formed by first depositing a metal layer (not shown) on the exposed surface of the copper layer 108 followed by a thermal treatment step. Finally, the un-reacted metal is selectively removed by proper an appropriate etching process to leave the copper compound on the exposed copper surface. The copper compounds can be also formed by exposing a copper surface to silane ($SiH_4$) plasma to selectively form the copper silicide. Further, an electrochemical plating (ECP) process (not shown) can be also used to form copper alloys containing minor amounts of refractory metal such as zinc (Zn), manganese (Mn), titanium (Ti), aluminum (Al) germanium (Ge) on the top surface of each copper layer 108. Thus, the material of the protection layer 120 can be conductive material such as tantalum, tantalum nitride, tungsten, tungsten nitride, metal nitride, copper alloys, copper compounds or a combination thereof.

Figure 3:
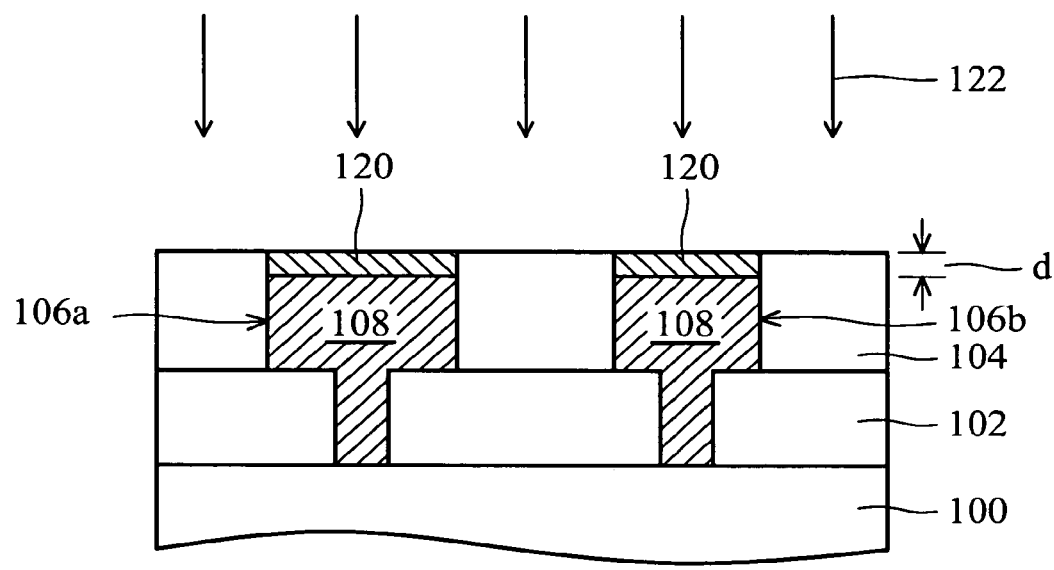

In addition, the copper-based material of the copper layer 108 can be further recessed with a depth d beneath the surface of adjacent second insulating layer 104. The depth d is about 100 Å to 1000 Å and can be achieved by an additional over-etch step of the etching back process or an over polishing step of the CMP process during the planarizing of the copper layer 108. Next, the protection layer 120 can be formed by the described self-aligned process 122 and can be thus left in each recess above each copper layer 108 and shows a substantially planar surface, as shown in FIG. 3.

Figure 4:
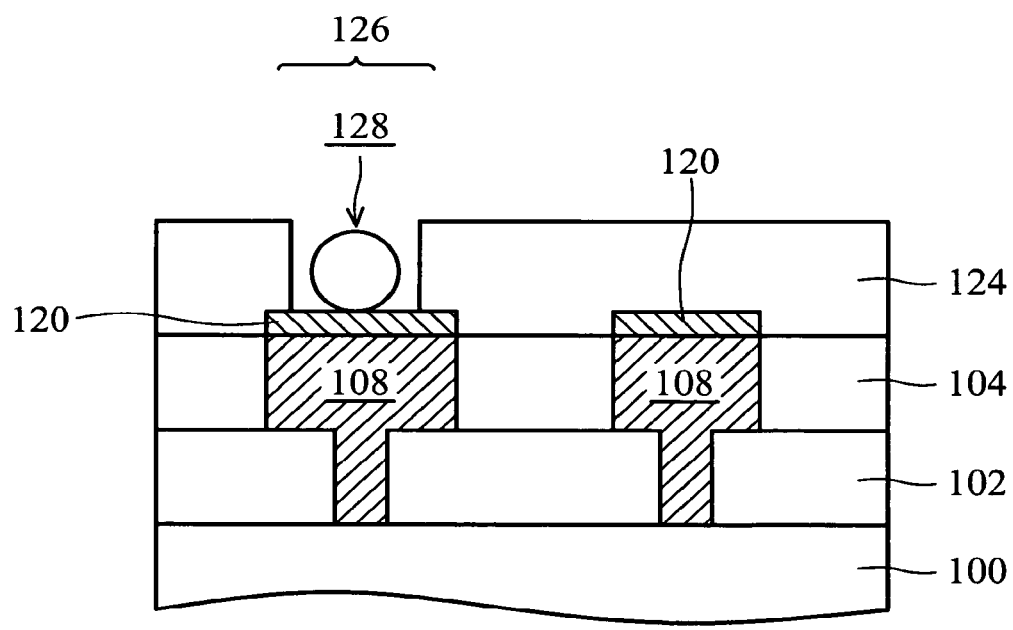

In FIG. 4, a passivation layer 124 is then formed over each second insulating layer 104 and covers the protection layers 120 to prevent the copper layers 108 from mechanical scratches and surrounding moisture. The material of the passivation layer 124 can be, for example, silicon oxide, silicon nitride, silicon oxynitride, spin-on glass (SOG) or a combination thereof. Next, the passivation layer 124 is patterned to form an opening therein, exposing a portion of the protection layer 120 as a bonding pad region 126 for the use of sequential wire bonding or flip-chip bonding. Due to the anti-oxidation protection provided to the bonding region 126 by the exposed protection layer 120, a conductive bump 128 such as solder bump or gold bump, can be then formed therein without oxidizing the copper layer 108 thereunder, thus ensuring the reliability of the copper-based bonding pad. Further, conductive wires such as gold wires or aluminum wires used in conventional wire bonding technology can be also formed therein.

As shown in FIG. 4, a copper bonding pad with a protection layer formed thereon is illustrated. In the invention, the protection layer 120 can be self-aligned formed on the underlying copper bonding pad (referring to one copper layer 108) without an additional photolithography process and can be thus easily fabricated. Moreover, the copper-based material of the bonding pad costs less than conventional aluminum bonding pad and the thickness of the copper bonding pad can be also reduced due to better conductivity of the copper-based material. Due to the anti-oxidation protection provided to the copper bonding pad by the protection layer, either conductive bumps for flip-chip bonding technique or conductive wires for conventional wire bonding technique can be formed on the copper bonding pad of the invention without oxidizing the copper layer therein and the reliability thereof can thus be ensured.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a bonding structure, comprising the steps of:

forming an insulating layer over a substrate;

forming a copper-based pad in the insulating layer;

recessing the copper-based pad to form a recessed copper-based pad and an opening exposing the recessed copper-based pad in the insulating layer;

forming a protection layer in the opening, wherein the protection layer has a substantially planar surface which is level with a top surface of the insulating layer and is vertically self-aligned with a top surface of the recessed copper-based pad without an addition photolithography process for patterning thereof, and wherein the protection layer is a copper compound formed of copper nitride;

forming a passivation layer over the copper-based pad and the insulating layer; and patterning the passivation layer to expose a portion of the protection layer.

2. The method as claimed in claim 1, further comprising the step of forming a conductive bonding on the exposed protection layer.

3. The method as claimed in claim 1, wherein the insulating layer comprises organic low-k material formed by spin-on method.

4. The method as claimed in claim 1, wherein the insulating layer comprises inorganic low-k material formed by a CVD method.

5. The method as claimed in claim 1, wherein the protection layer is a copper nitride formed by nitridation process.

6. The method as claimed in claim 1, wherein the thickness of the protection layer is 100 Å to 1000 Å.

7. The method as claimed in claim 1, wherein the protection layer is a copper silicide formed by silicidation process.

8. The method as claimed in claim 1, wherein the passivation layer comprises a material selected from a group consisting of silicon oxide, silicon nitride, silicon oxynitride, and a combination thereof.

9. The method as claimed in claim 1, wherein the thickness of the protection layer is 100 Å to 400 Å.

10. The method as claimed in claim 1, wherein the step of forming a copper-based pad in the insulating layer further comprises a dual damascene process.

11. The method as claimed in claim 1, wherein the protection layer prevents oxidation.

12. The method as claimed in claim 1, wherein the protection layer prevents oxidation, thereby improving reliability.

13. The method as claimed in claim 1, wherein the protection layer is aligned to the copper-based pad.

14. The method as claimed in claim 1, wherein the step of forming a protection layer vertically self-aligned with a top surface of the copper-based pad is performed subsequent to a dual damascene process.

15. The method as claimed in claim 7, wherein the silicidation process comprises exposing the top surface of the copper-based pad to silane plasma.

\* \* \* \* \*